United States Patent
Kuncham et al.

(10) Patent No.: US 12,096,364 B2
(45) Date of Patent: Sep. 17, 2024

(54) LOW-POWER DUAL DOWN-CONVERSION WI-FI WAKE-UP RECEIVER

(71) Applicant: Texas Instruments Incorporated, Dallas, TX (US)

(72) Inventors: Sucheth Suresh Babu Kuncham, Bengaluru (IN); Arnab Das, Bengaluru (IN); Pranav Sinha, Bengaluru (IN); Meghna Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 63 days.

(21) Appl. No.: 17/530,059

(22) Filed: Nov. 18, 2021

(65) Prior Publication Data

US 2022/0167271 A1 May 26, 2022

(30) Foreign Application Priority Data

Nov. 25, 2020 (IN) .............................. 202041051286

(51) Int. Cl.
*H04W 52/02* (2009.01)
*H03M 1/18* (2006.01)
*H04L 5/00* (2006.01)
*H04W 84/12* (2009.01)

(52) U.S. Cl.
CPC ....... *H04W 52/0229* (2013.01); *H03M 1/185* (2013.01); *H04L 5/0007* (2013.01); *H04W 84/12* (2013.01)

(58) Field of Classification Search
CPC .............. H04W 52/0229; H04W 84/12; H04L 5/0007; H04L 27/02; H03M 1/185; Y02D 30/70
See application file for complete search history.

(56) References Cited

U.S. PATENT DOCUMENTS

| 8,542,779 B2* | 9/2013 | Xu ....................... H04L 27/2071 375/329 |
| 2019/0288887 A1* | 9/2019 | Wentzloff ................ H04B 1/30 |
| 2020/0076651 A1* | 3/2020 | Sun .................... H04L 25/03885 |
| 2020/0106651 A1* | 4/2020 | Park ..................... H04L 27/2628 |
| 2021/0368440 A1* | 11/2021 | Landis .................. H04W 72/23 |

* cited by examiner

*Primary Examiner* — Marcos L Torres
(74) *Attorney, Agent, or Firm* — Mandy Barsilai Fernandez; Frank D. Cimino

(57) ABSTRACT

A Wi-Fi wake-up receiver that receives wake-up signals encoded using orthogonal frequency division multiplexing based on-off keying (OFDM-OOK) modulation includes receiver circuitry having analog envelope detector circuitry configured to non-linearly down-convert an input signal and provide an energy signal for sampling by an analog-to-digital converter (ADC). A wake-up signal for waking up a main radio in a Wi-Fi device can be based on the digitized energy signal. The receiver circuitry can further include, upstream of the envelope detector circuitry and the ADC in the signal chain, an analog mixer for linearly down-converting the input signal and a low-pass filter for attenuating adjacent-channel interferer (ACI) signals prior to the non-linear down-conversion by the envelope detector circuitry. Sampling of the energy signal rather than the higher-bandwidth input signal yield power savings in the ADC and associated circuitry such as a modem.

20 Claims, 7 Drawing Sheets

LOW-POWER DUAL DOWN-CONVERSION WI-FI WAKE-UP RECEIVER

CROSS-REFERENCE TO RELATED APPLICATION

This application claims priority to Indian provisional patent application No. 202041051286 filed Nov. 25, 2020.

TECHNICAL FIELD

The present invention relates generally to electronic circuits, and particularly to a low-power dual down-conversion Wi-Fi a wake-up receiver.

BACKGROUND

The relatively high power consumption of Wi-Fi technology poses challenges to its adoption in low-power devices such as wireless sensor nodes and Internet-of-Things (IoT) devices. To address power consumption concerns, Wi-Fi devices, for example, those that are battery-powered, can include a wake-up radio receiver (WuRx) and thereby make use of an energy-efficient data reception mode that does not show an increase in latency as compared to a main operating mode. A wake-up radio includes an add-on radio-frequency (RF) receiver with extremely low power consumption, e.g., less than about one milliwatt at a battery voltage $V_{bat}$, that is used to transmit control information from an access point to a receiver device while a primary radio in the receiver device is switched off as a power-saving measure. In such receiver devices, energy-efficient data transmission can be provided, and channel time consumption can be reduced, using, for example, the IEEE 802.11ba protocol.

SUMMARY

An example Wi-Fi wake-up receiver includes receiver circuitry having an input adapted to be coupled to a RF receiver antenna. The receiver circuitry includes an analog mixer, a low-pass filter, analog envelope detector circuitry, and an analog-to-digital converter (ADC). The analog mixer has a signal input and an output. The low-pass filter has an input coupled to the output of the analog mixer, and is configured to attenuate adjacent-channel interferer (ACI) signals. The analog envelope detector circuitry has an input coupled to an output of the low-pass filter, and is configured to provide an energy signal. The ADC has an input coupled to an output of the analog envelope detector circuitry, and is configured to sample the energy signal.

Another example provides a method of low-power dual down-conversion in a Wi-Fi wake-up receiver. A linear down-conversion of an RF orthogonal frequency division multiplexing based on-off keying (OFDM-OOK) modulated Wi-Fi wake-up receiver signal is performed to provide a down-converted signal. The down-converted signal is low-pass filtered to provide a blocker-attenuated signal. A non-linear down-conversion is performed on the blocker-attenuated signal using an analog energy detector to provide an analog energy signal. The analog energy signal is sampled using an ADC to provide a digitized energy signal.

An example wireless Wi-Fi device includes an RF antenna, a main transceiver coupled to the RF antenna, and a wake-up radio receiver coupled to the RF antenna and to the main transceiver. The wake-up radio receiver is configured to receive and process RF signals encoded using OFDM-OOK modulation. The wake-up radio is configured to provide the main transceiver with a wake-up signal. The wake-up radio receiver includes analog envelope detector circuitry having an input coupled to the RF antenna. The analog envelope detector circuitry is configured to provide an energy signal. The wake-up radio receiver further includes an ADC having an input coupled to an output of the analog envelope detector circuitry. The ADC is configured to sample the energy signal to provide a digitized energy signal. The wake-up radio receiver further includes a modem having an input coupled to an output of the ADC. The modem is configured to generate the wake-up signal based on the digitized energy signal.

DETAILED DESCRIPTION

A Wi-Fi wake-up receiver can use energy sampling to reduce the complexity and power requirements of the analog-to-digital conversion of an incoming wake-up radio signal. By using a first linear down-conversion followed by filtering for blockers and a second analog non-linear down conversion prior to sampling of the radio signal, the energy-sampling architectures and methods described in the present application can realize power savings benefits while also retaining immunity to interference from devices operating on adjacent channels.

Figure 1:
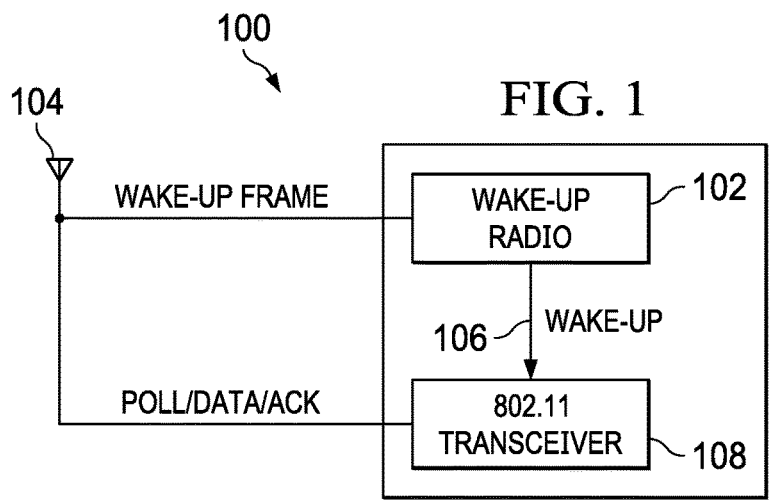
FIG. 1 is a high-level block diagram of an example Wi-Fi device having a reduced-power wake-up radio as an add-on radio, additional to a main transceiver.

FIG. 1 illustrates a Wi-Fi device 100 having a low-power listen-mode wake-up radio receiver 102 configured to use, for example, orthogonal frequency division multiplexing based on-off keying (OFDM-OOK) modulation. Wake-up receiver 102 can be coupled to an RF antenna 104 to receive a wake-up frame, and can have a wake-up signal output 106 coupled to a wake-up signal input of a main receiver 108 (illustrated as an 802.11 transceiver). Upon receiving the wake-up frame, wake-up receiver 102 can send a wake-up signal via the wake-up signal output 106 to bring the main receiver 108 out of a low-power sleep mode for reception and/or transmission of signals via antenna 104.

Wake-up receiver 102 can be further configured to operate with the same dynamic range as the main receiver 108 in the Wi-Fi device 100, e.g., between about −90 dBm and about −20 dBm, and can be configured to tolerate similar adjacent-channel interferers (ACIs, also referred to as "blockers") as the main receiver 108. Overall system design and production overhead efficiencies can be realized by configuring the wake-up receiver 102 such that modulation-demodulation (modem) operations, such as automatic gain control (AGC) and synchronization, and post-silicon calibrations, such as filter bandwidth, are maintained to be similar to those of the main receiver 108. Accordingly, the wake-up receiver 102 can be configured with an analog-to-digital converter (ADC) similar to that of main receiver. However, the ADC of the main receiver may consume a substantial amount of power, for example, about 10 mW, and the ADC may be the most dominant contributor to overall power consumption in the wake-up receiver 102. Sufficiently scaling down a main receiver ADC for use in the wake-up receiver 102 therefore poses the most significant challenge to reducing power consumption in the wake-up receiver 102.

The systems and methods of the present application address Wi-Fi wake-up receiver signal chain power consumption, including local oscillator (LO) power consumption and ADC power consumption, by performing pre-processing to Wi-Fi wake-up receiver ADC inputs so that the wake-up receiver ADC can operate at a relaxed sampling frequency and/or effective number of bits (ENOB) specification, and can still maintain existing main-receiver methodologies for functionalities, such as AGC, synchronization, packet detection, and post-silicon calibration methodologies for achieving, for example, a particular bandwidth or gain. Very low wake-up receiver power consumption can be achieved by relaxing the constraints on modules such as the voltage-controlled oscillator (VCO) and ADC and working with single-chain down-conversion. For example, allowing the ADC to sample at a much lower sampling frequency can result in significant power consumption savings. Because the 802.11ba wakeup receiver protocol encodes data with OOK modulation, data is encoded as energy in the RF-transmitted wake-up signal. To reduce development effort, 802.11ba adopted OFDM-OOK modulation, inherited from the 802.11n protocol, and uses a Manchester signaling scheme. For a wake-up receiver that uses OOK modulation, non-coherent detection can be used in the wake-up receiver modem in order to reduce power consumption. Lower power consumption can be achieved in the wake-up receiver VCO by relaxing constraints such as frequency offset and drift. For example, the wake-up receiver can be configured to work with low-intermediate-frequency (low-IF) reception, in which an incoming RF signal is mixed down to a non-zero low or moderate intermediate frequency.

Figure 2:
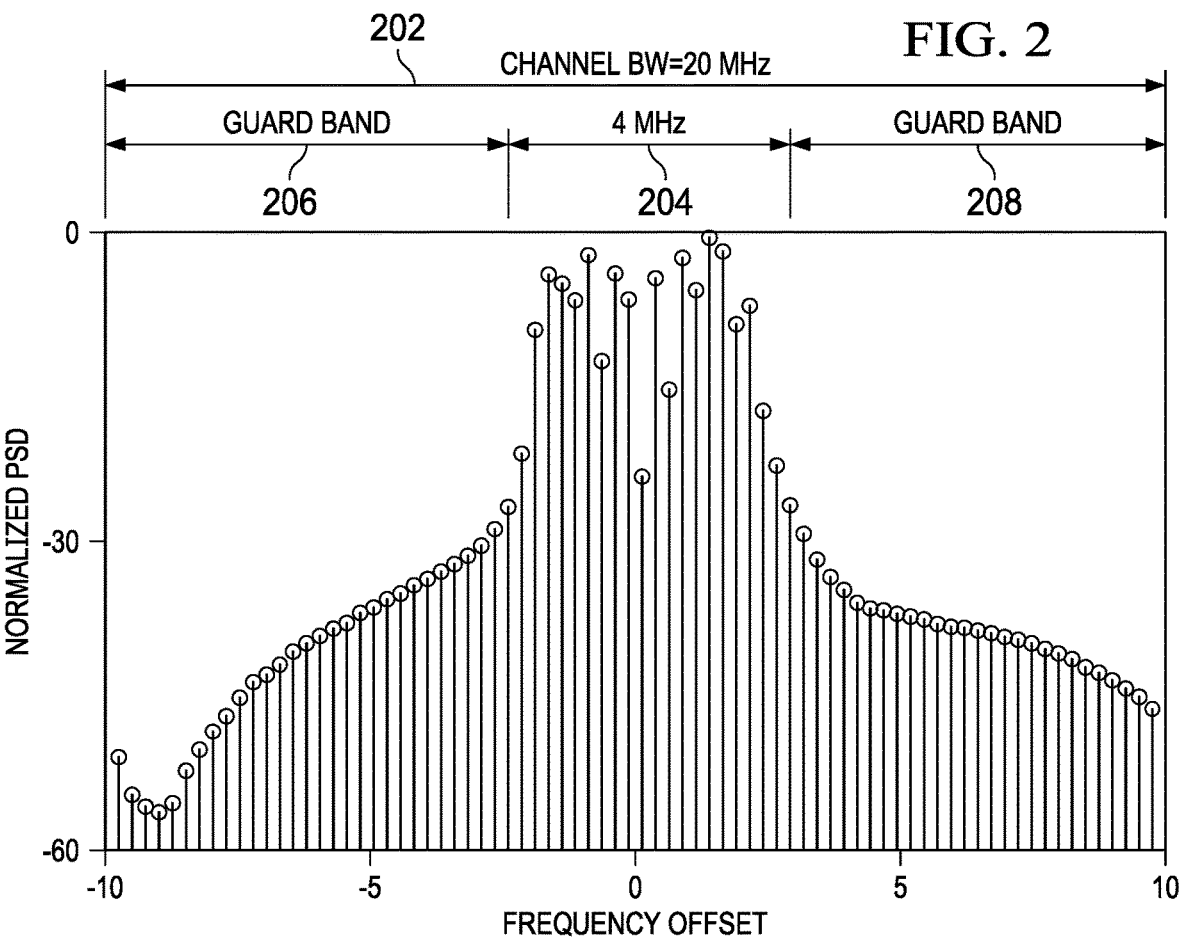
FIG. 2 is a power spectral density graph of an example Wi-Fi wake-up radio RF signal channel.
Figure 3:
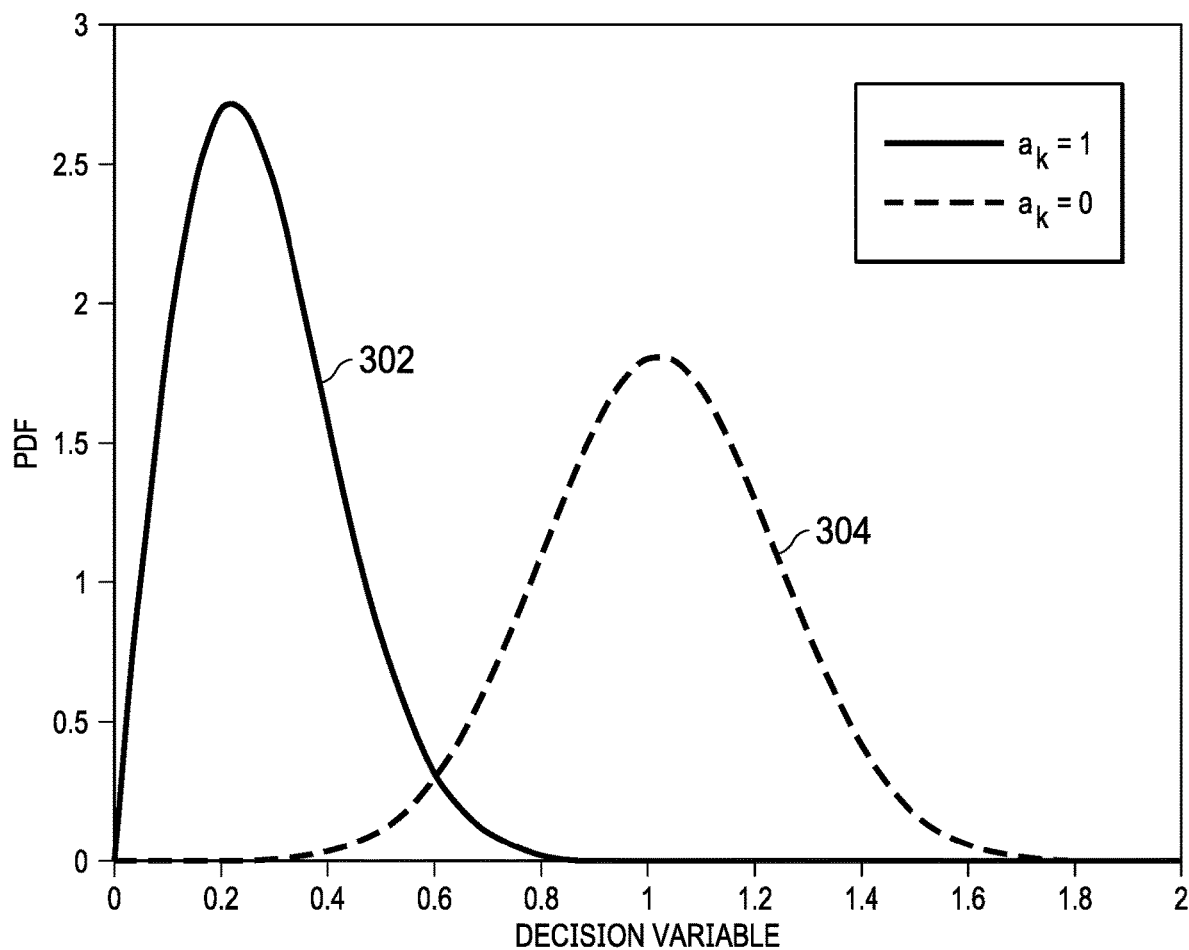
FIG. 3 is a probability distribution function graph of example squared on-off keying signals.

The graph of FIG. 2 illustrates the normalized power spectral density of an example incoming Wi-Fi RF signal in a single channel, such as may be received over RF antenna 104 in FIG. 1. As shown in FIG. 2, an about 20 MHz channel bandwidth 202 is composed of an about 4 MHz signal band 204 with about 8 MHz guard bands 206, 208 on either side. Table 1 shows the information structure of OFDM-OOK wake-up receiver RF signals for two different data rates specified under the protocol, a lower data rate (LDR) at 62.5 kilobits per second (kbps) and a higher data rate (HDR) at 250 kbps. The transmission of a logical "0" bit involves transmission of an ON-OFF-ON-OFF signal pattern over 16 microseconds at LDR and just an ON-OFF signal pattern over 4 microseconds at HDR. Conversely, the transmission of a logical "1" bit involves transmission of an OFF-ON-OF-ON signal pattern over 16 microseconds at LDR and just on OFF-ON signal pattern over 4 microseconds at HDR. The graph of FIG. 3 illustrates the probability distribution functions of squared OOK signals for a logical "0" 302 and a logical "1" 304.

TABLE 1

Information structure of OFDM-OOK wake-up receiver RF signals

| Data Rate | Information 0 | Information 1 |
| --- | --- | --- |
| LDR - 62.5 kbps | 4 µs ON + 4 µs OFF + 4 ps ON + 4 µs OFF | 4 µs OFF + 4 µs ON + 4 µs OFF + 4 µs ON |
| HDR - 250 kbps | 2 µs ON + 2 µs OFF | 2 µs OFF + 2 µs ON |

The use of low-IF reception in a Wi-Fi wake-up receiver architecture implies full signal bandwidth of 4 MHz with a single receiver. The associated Nyquist bandwidth also doubles and increases the effort required by ADC.

Figure 4:
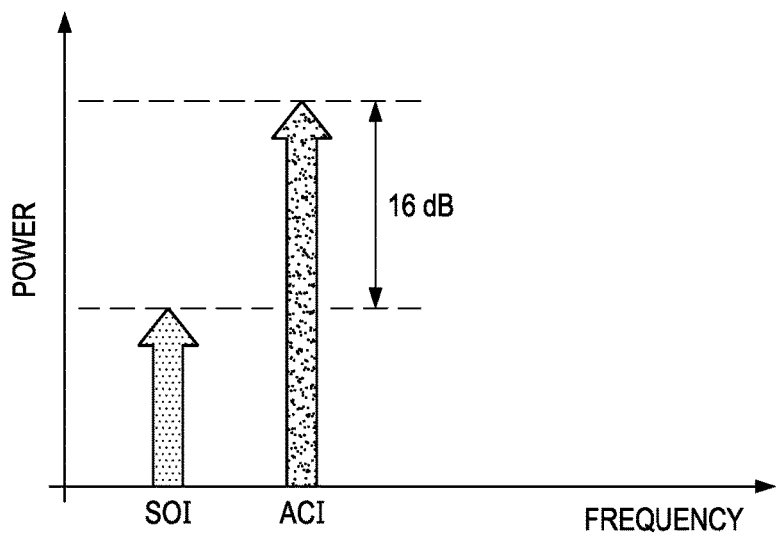
FIG. 4 is a frequency graph showing power of an example Wi-Fi wake-up receiver signal of interest in relation to an example adjacent-channel interferer signal.

Selectivity of an RF wake-up signal from a Wi-Fi transmitter in preference over one or more signals from one or more different devices, known as blockers or interferers, can be an important property of wake-up receivers. In general, wake-up receivers are based on the principle of energy detection. The existence of, and the need to address, ACIs poses constraints in the design and functioning of wake-up receiver systems. Wake-up receiver protocols dictate a certain level of tolerance to be offered by the receivers. As illustrated in FIG. 4, the 802.11ba protocol defines the need to tolerate an ACI that is 16 dB higher than the RF wake-up signal of interest (SOI).

Figure 5:
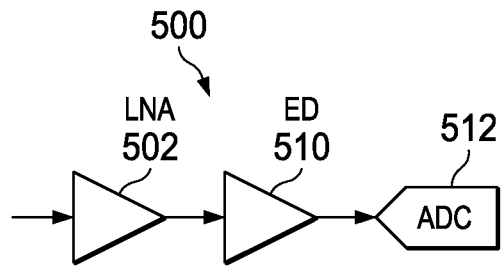
FIG. 5 is a high-level block diagram of an example wake-up receiver.

The block diagram of FIG. 5 shows an example wake-up receiver 500 in which the output of a low-noise amplifier (LNA) 502 that is configured to receive an RF wake-up receiver signal is coupled to the input of an envelope detector (ED) 510. The output of the ED 510 is, in turn, coupled to the input of an ADC 512. The output of the ADC 512 may in turn be coupled to a modem (not shown in FIG. 5) downstream of the receiver 500 in the signal chain. Receiver 500 samples an incoming RF signal (e.g., from an RF antenna, not shown in FIG. 5) as processed by the ED 510. Because the ED 510 is upstream of the ADC 512 in the signal chain, it may be referred to as an up-front ED. Applying envelope detection at RF eliminates the need for a mixer and LO. Given the above-described ACI constraints, however, non-coherent detection fails to differentiate between the RF wake-up SOI and an ACI, consequently resulting in wake-up false positives from the detection of ACI power and consequently diminishing the overall power-saving effectiveness of the wake-up receiver, because of power-consuming false wake-ups of the main receiver. For this reason, the example of receiver 500 of FIG. 5 is not useful in practical scenarios in which blockers may be present.

Figure 6:
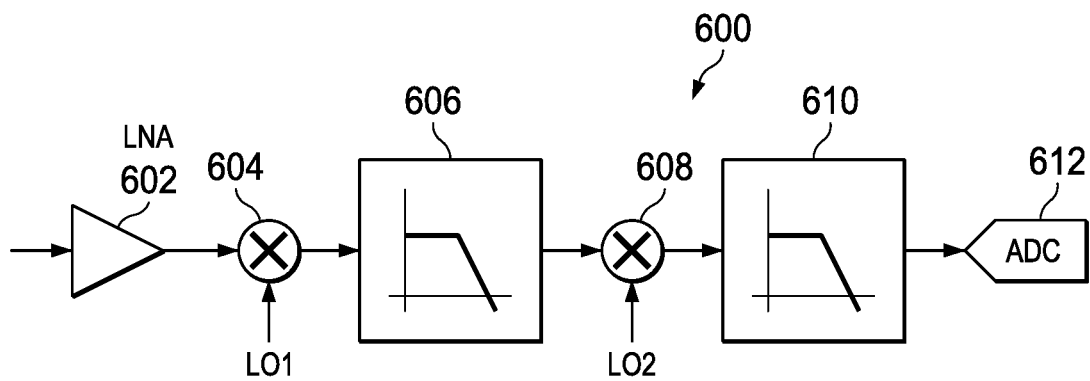
FIG. 6 is a high-level block diagram of an example Wi-Fi wake-up receiver with double down-conversion.

The block diagram of FIG. 6 shows an example Wi-Fi wake-up receiver with double down-conversion 600. The output of LNA 602, which is configured to receive an RF wake-up receiver signal, is coupled to the input of a first analog mixer 604, where the received signal is mixed with a first LO mixing signal LO1. The output of first mixer 604 is coupled to an input of a first low-pass filter (LPF) 606. The output of first LPF 606 is coupled to an input of a second analog mixer 608, where the now mixed and filtered signal is subsequently mixed with a second mixing signal LO2. The output of second mixer 608 is coupled to an input of a second low-pass filter (LPF) 610. The output of second LPF 610 is coupled to an input of ADC 612. In the illustrated topology, mixers 604, 608 are configured to down-convert the incoming RF signal to a baseband signal. Filtering circuits 606, 610 are configured to remove ACI signals from the incoming signal before it is sampled by the ADC 612. Although the topology of FIG. 6 may comply with the ACI filtering requirements of the 802.11ba protocol, the multiple stages nevertheless are highly power consumptive. The minimum Nyquist ADC sampling frequency should be twice the SOI bandwidth, and in practice, the sampling frequency must be configured to be even greater than twice the SOI bandwidth after factors such as VCO drift and interferer constraints are taken into account. The relatively high sampling frequency imposed by receiver 600 requires substantial power consumption on the part of the wake-up receiver ADC 612. The topology of receiver 600 also demands additional power to generate a second LO signal LO2 for second stage down-conversion.

Figure 7:
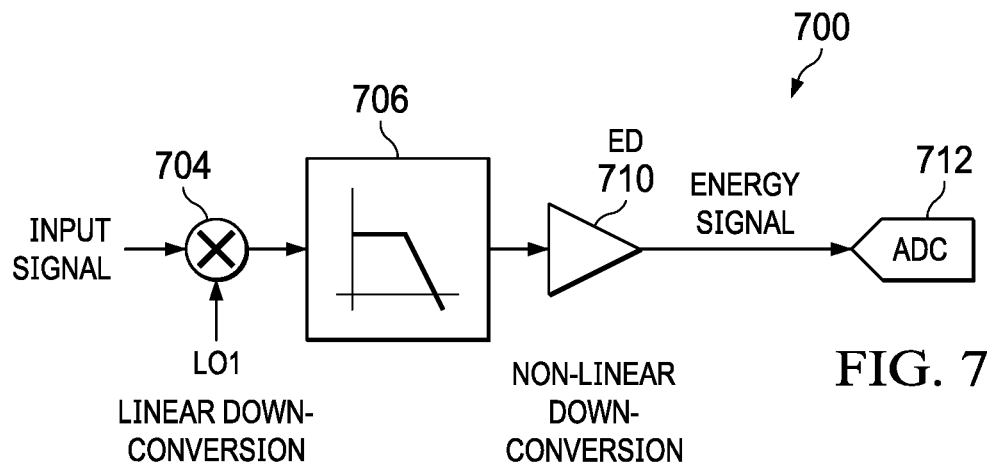
FIG. 7 is a high-level block diagram of an example Wi-Fi wake-up receiver with energy sampling.

The block diagram of FIG. 7 shows an example wake-up receiver with energy sampling 700. The input of passive analog mixer 704 is configured to receive an RF wake-up receiver signal, in some examples from the output of an LNA (not shown in FIG. 7). The received signal is mixed with an LO mixing signal LO1, thus performing a linear down-conversion of the received signal. The output of mixer 704 is coupled to an input of LPF 706 configured as an intermediate frequency (IF) filter to remove blockers. The output of LPF 706 is coupled to an input of ED 710, where the now linearly down-converted and filtered signal undergoes a non-linear down-conversion. As the information in the SOI is encoded as energy, ultimately the signal energy, rather than the signal itself, is what is measured. The ED 710 thus in effect performs self-mixing of the baseband signal to, for example, convert a high-frequency OFDM-OOK signal having a bandwidth of about 4 MHz to a low-frequency OOK signal having a bandwidth of about 125 kHz. This reduces the effective signal bandwidth at the input of the ADC 712 leading to a lower ADC sampling frequency and lower power consumption. Moreover, because receiver 700 performs power estimation in the analog domain with ED 710, receiver 700 does not require digital-domain power estimation circuitry. The configuration of receiver 700 has the advantage of reducing the design effort of both the ADC 712 and the downstream modem (not shown in FIG. 7).

Figure 8:
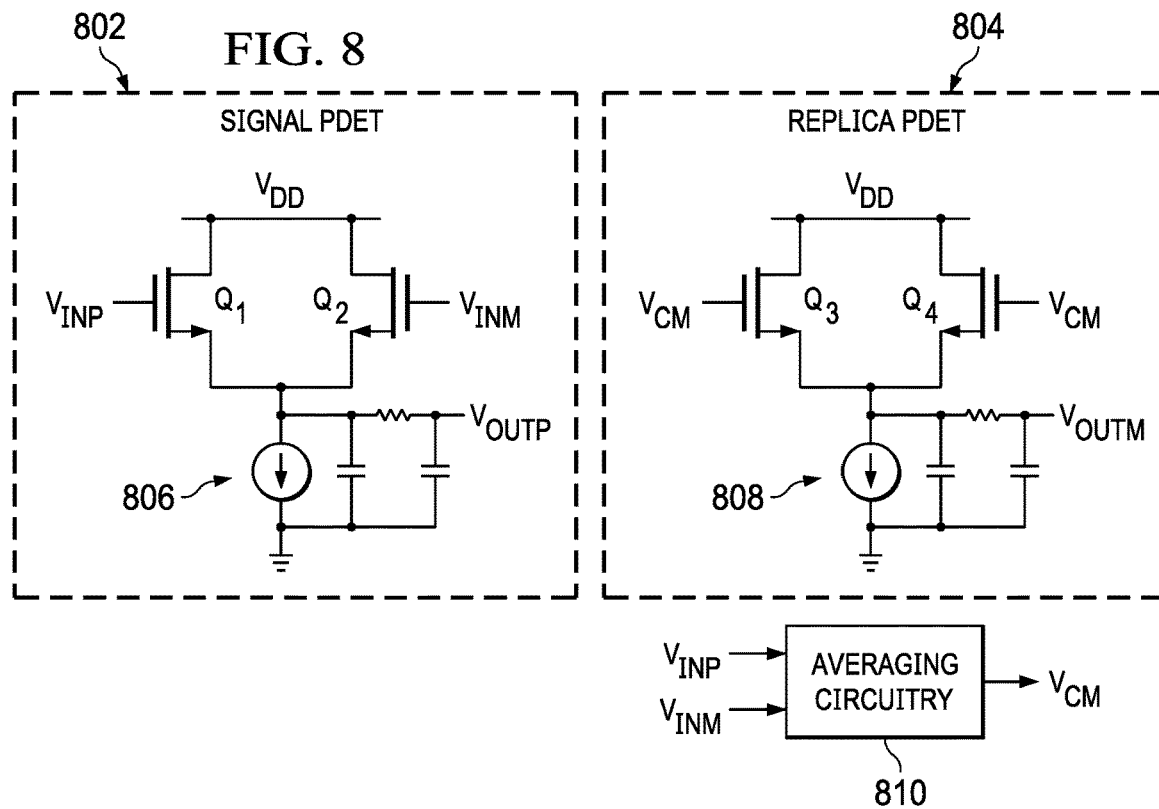
FIG. 8 is a circuit schematic of example analog-domain power estimation circuitry.

A simple form of circuitry that will function as ED 710 is squaring circuitry. The electronic schematic of FIG. 8 illustrates example analog-domain power estimation circuitry that can be used as ED 710 in the receiver 700 of FIG. 7. The power estimation circuitry of FIG. 8 functions as squaring circuitry having two identical halves, a signal power detection (PDET) circuit 802 and a replica PDET circuit 804, and having differential voltage inputs $V_{INP}$, $V_{INM}$, common-mode voltage input $V_{CM}=(V_{INP}+V_{INM})/2$ (representative of the DC bias of $V_{INP}-V_{INM}$), positive rail $V_{DD}$, a ground node, and differential outputs $V_{OUTP}$, $V_{OUTM}$. Averaging circuitry 810 in a preceding circuit stage can be coupled to the power estimation circuitry to provide the common-mode voltage input $V_{CM}$. The two halves 802, 804 have respective constant current sources 806, 808 that provide biasing, and associated capacitors and resistors (shown but not labeled) forming respective RC low-pass filters, as well as matched differential pairs of field effect transistors (FETs) $Q_1$, $Q_2$, $Q_3$, $Q_4$. For example, all four FETs $Q_1$, $Q_2$, $Q_3$, $Q_4$ can be matched to each other. For example, FETs $Q_1$, $Q_2$, $Q_3$, $Q_4$ can be metal-oxide-semiconductor FETs (MOSFETs). Each half has a node at its middle coupling together the respective current source and the source nodes of the matched pair of FETs. The RC low-pass filter of each half is coupled at a first terminal to this middle node, at a second terminal to the ground node, and at a third terminal to an output port.

Each of the two halves 802, 804 are in the form of a source-coupled differential pair. Instead of providing the function of a common-source differential amplifier, each of the halves 802, 804 provides at its respective output the square of the difference between its two inputs. Once input signals is coupled to the respective FET gates of a respective half 802 or 804, the energy of the signal is modulated as DC due to the second order nonlinearity of each FET. The second harmonic component is filtered using the respective RC low-pass filter, leaving only the DC signal. This DC includes the DC bias as well as the DC component due to the down-converted signal. The replica bias differential pair in replica PDET 804 is used to remove the DC bias from this output. The DC bias of the input signal is provided to the gates of each of the replica differential pair FETs. Their output consequently contains the DC bias voltage. The output is taken as the difference of the output voltages $V_{OUTP}-V_{OUTM}$ of the two differential pairs, which removes the DC bias and preserves the down-converted DC signal. The differential output difference $V_{OUTP}-V_{OUTM}$ thus provides the square of the differential input difference $V_{INP}-V_{INM}$ as corrected for DC bias by the functioning of the replica PDET 804. ED 710 of FIG. 7 may be implemented using the power estimation circuitry shown in FIG. 8 or with power estimation circuitry more complex than that illustrated in FIG. 8 as may be needed to satisfy system specifications.

Following ED 710 in FIG. 7, ADC 712 can, in effect, sample the lower-bandwidth energy of the input signal ("energy signal") rather than sampling the higher-bandwidth input signal directly. Reduced ADC sampling frequency is thus one advantage of performing power estimation in the analog domain. The below equation shows that when an input signal of the form $A\cos(\omega t)$ is squared, the result is a DC term, in this case $A^2/2$, wherein the energy content is present, and a higher harmonic term:

$$(A\cos(\omega t))^2 = \frac{A^2}{2} + \frac{A^2}{2}\cos(2\omega t)$$

The DC term is a low-frequency signal, and sampling this low-frequency signal with an ADC is much simpler and the computational effort and power consumption of the ADC is much less.

Figure 9:
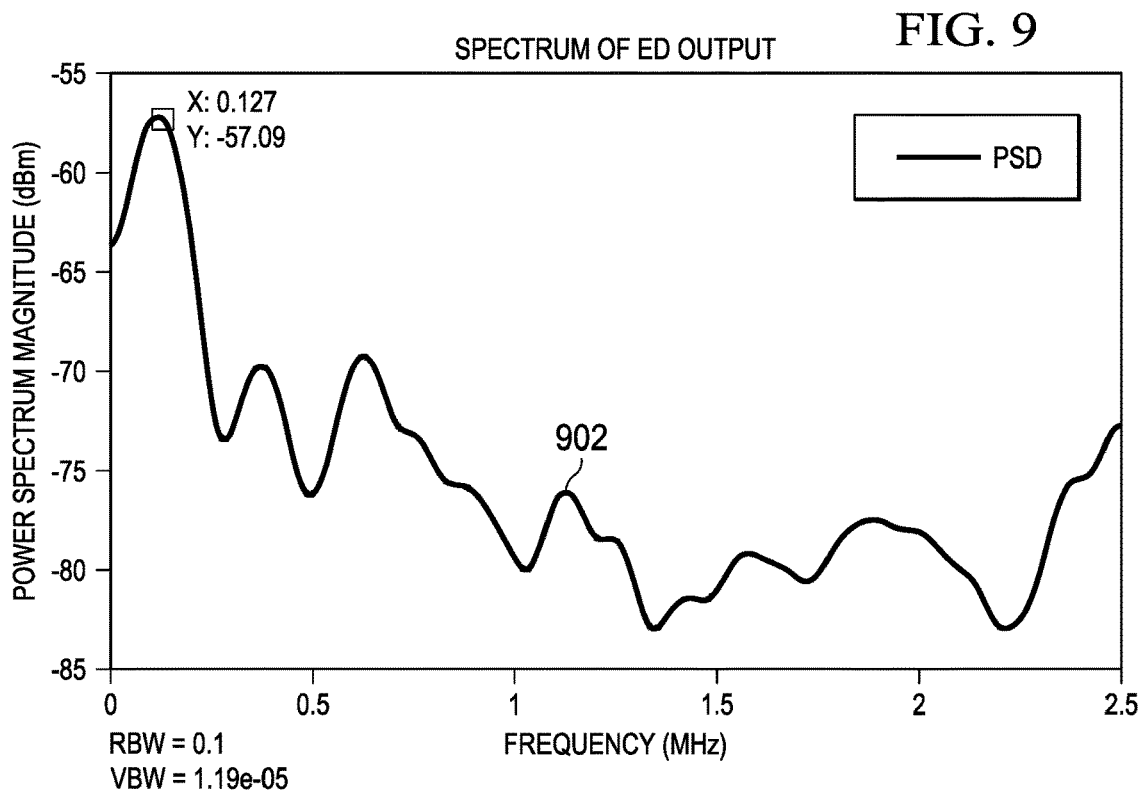
FIG. 9 is a frequency graph of the power spectrum magnitude of an example envelope detector output.

A Wi-Fi wake-up energy signal that uses OOK modulation and the Manchester signaling scheme has bandwidth of about 125 kHz (LDR) or 250 kHz (HDR). FIG. 9 is a plot the power spectral density (PSD), which is the power in the frequency domain, of an example energy signal for a Wi-Fi wake-up signal transmitted under an LDR protocol. The energy signal has a peak at around 125 kHz, showing that the example energy signal is concentrated at that frequency. By contrast, a Wi-Fi wake-up OFDM-OOK input signal has a bandwidth of around 4 MHz, as shown in FIG. 2. Not shown, a corresponding energy signal under an HDR protocol would have a peak at about 250 kHz. The lowered bandwidth of the energy signal as compared to the input signal enables a high over sampling ratio (OSR). The same packet error rate (PER) can thus be achieved with about one quarter the sampling frequency (e.g., 5 MHz as compared to 20 MHz) by sampling the energy signal as compared to sampling the input signal directly. This reduction in sampling rate significantly reduces the power consumption of the ADC 712 in receiver 700 as compared, for example, to ADC 612 in receiver 600.

Effective number of bits (ENOB) can serve as a metric of the dynamic range of an ADC. The ability to operate within Wi-Fi wake-up receiver protocol specifications at a lower ENOB therefore implies a less complex, less costly, and less power-consumptive ADC can be used in the wake-up receiver. The OFDM bins of the wake-up receiver can be chosen in such a way that the peak-to-average ratio (PAR) of the energy signal is about 2.5 dB higher than the input signal. Non-coherent demodulation can be used in view of the power constraints and OOK modulation. A low (e.g., ten percent) packet error rate (PER) can be achieved in receiver 700 by sampling the peaks of the ON signals in OOK modulation. Thus, the 2.5 dB increase in PAR can reduce the ENOB at which the ADC operates by about 0.5 bit.

Figure 10:
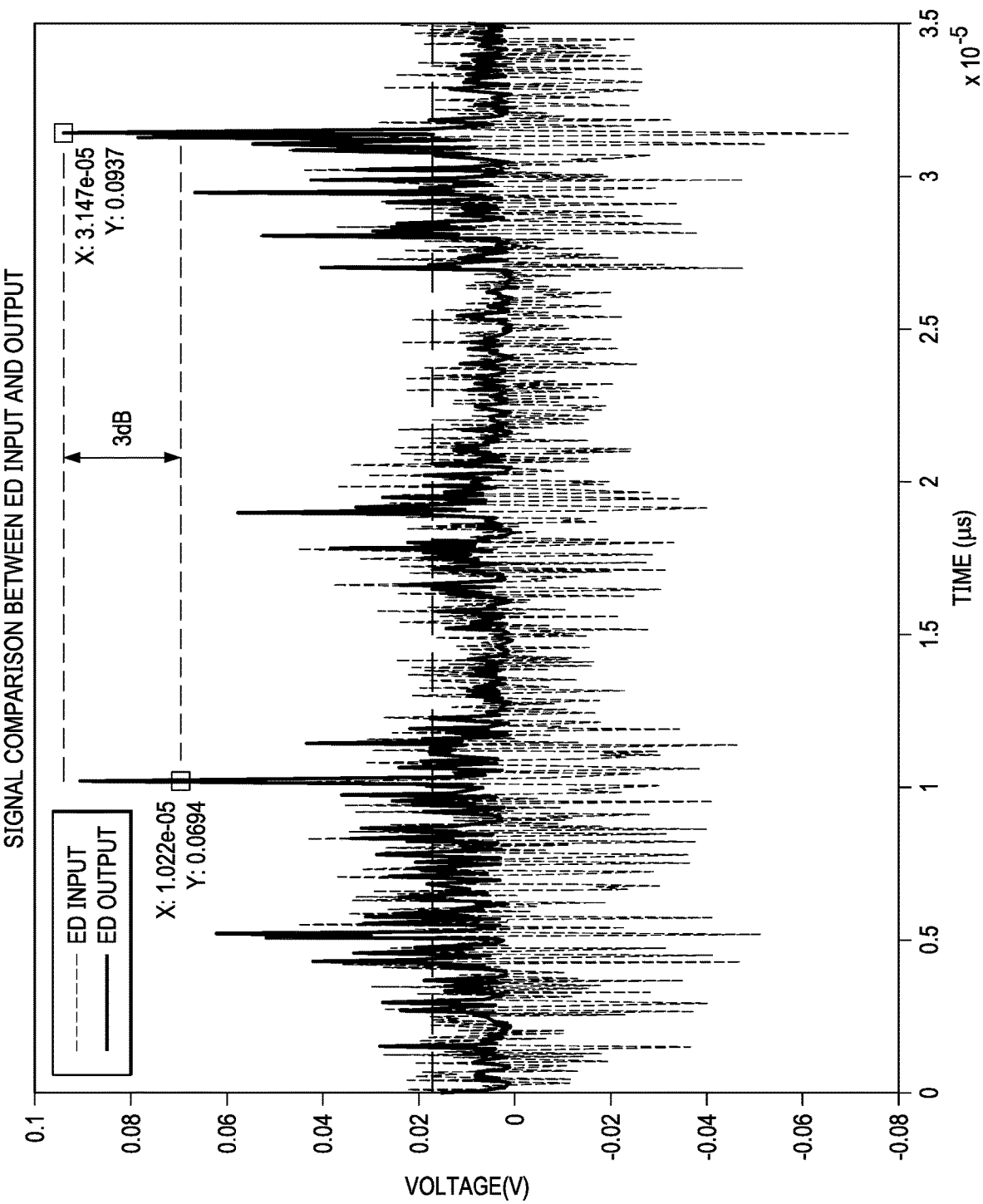
FIG. 10 is a time-domain graph of voltages of an example Wi-Fi wake-up receiver signal before and after processing by an envelope detector.

FIG. 10 further illustrates the benefit of enhancement of voltage peaks in the resultant energy signal as achieved by squaring the Wi-Fi wake-up receiver RF input signal using, for example, ED 710. FIG. 10 is a time-domain voltage graph comparing an example signal as input to ED 710 in receiver 700 with a corresponding resultant energy signal as output from ED 710, illustrating the increase in ON signal peak amplitudes and reduction in OFF signal power. The enhanced difference between the ON and OFF powers further aids the demodulation process.

Power consumption reduction of energy sampling methods using an ED upstream of an ADC as implemented, for example, by receiver 700 is further aided by the reduced concentration of noise in comparison to methods using only linear conversion and sampling ("direct sampling"), as implemented, for example, in receiver 600, followed by power estimation in the digital domain. The PER depends on the signal-to-noise ratio (SNR) of the signal at the decoder. In a direct sampling example, the entire signal S includes signal ($S_{sig}$), thermal noise ($N_T$), and quantization noise ($N_Q$) components:

$$S = S_{sig} + N_T + N_Q$$

After power estimation in digital domain, the power of the digitized signal $P_{ADC}$ is equal to the square of the pre-power-estimation as follows:

$$P_{ADC} = S^2 = (S_{sig} + N_T + N_Q)^2$$

$$P_{ADC} = S^2_{sig} + 2S_{sig}N_T + N^2_T + 2S_{sig}N_Q + 2N_TN_Q + N^2_Q$$

In the energy sampling case, however, in which an analog energy detection is implemented upstream of analog-to-digital conversion, the power of the non-linearly down-converted and digitized signal $P_{ED\_ADC}$ is:

$$P_{ED\_ADC} = (S_{sig} + N_T)^2 + N_Q$$

$$P_{ED\_ADC} = S^2_{sig} + 2S_{sig}N_T + N^2_T + N_Q$$

The noise components present in $P_{ED\_ADC}$ are lesser than in $P_{ADC}$, thereby improving the SNR of the wake-up signal. In particular, the quantization noise component is not squared in $P_{ED\_ADC}$, nor does $P_{ED\_ADC}$ include a term in which the quantization noise is doubled and multiplied by the sum of the signal component and the thermal noise component.

Figure 11:
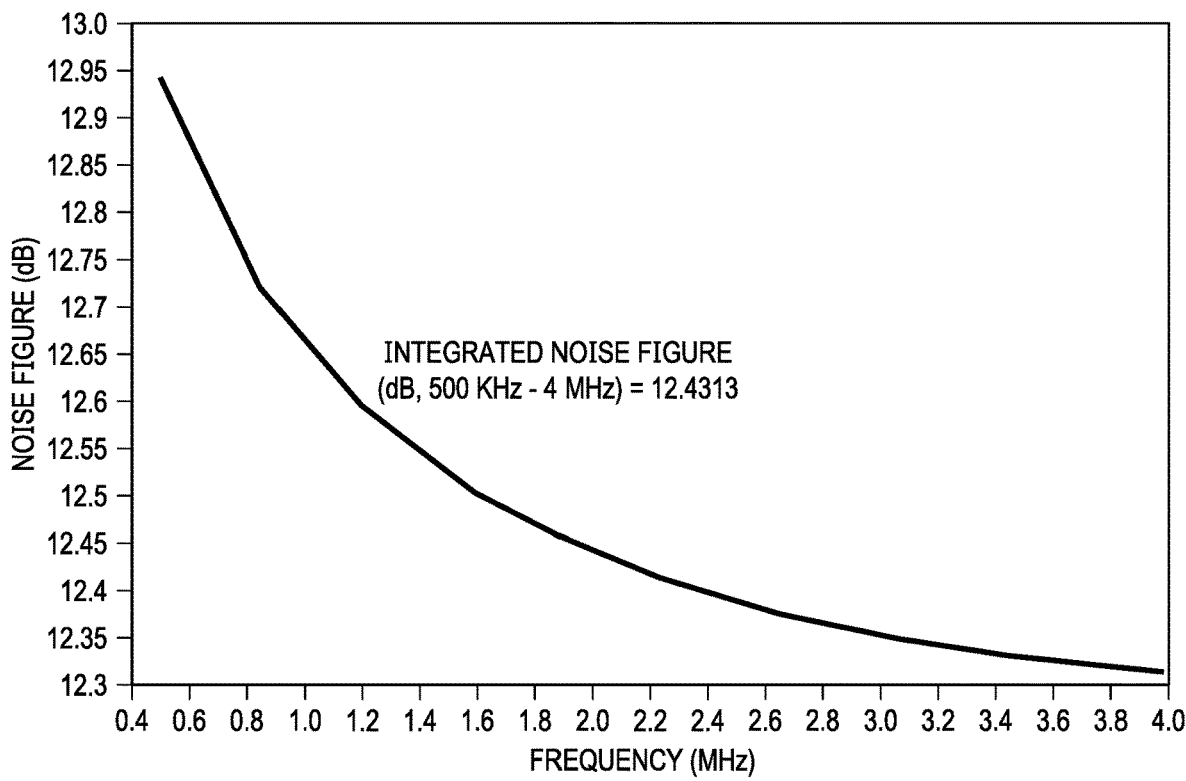
FIG. 11 is a frequency graph illustrating example noise figure values.

Noise figure (NF) is a measure of SNR degradation caused by components in a signal chain, by which the performance of a radio receiver can be specified, with lower values indicating better performance. FIG. 11 illustrates an example NF plot as a function of frequency for a Wi-Fi wake-up receiver implementing an energy sampling receiver such as receiver 700. As shown, the receiver offers a noise figure of about 12.5 dB.

Figure 12:
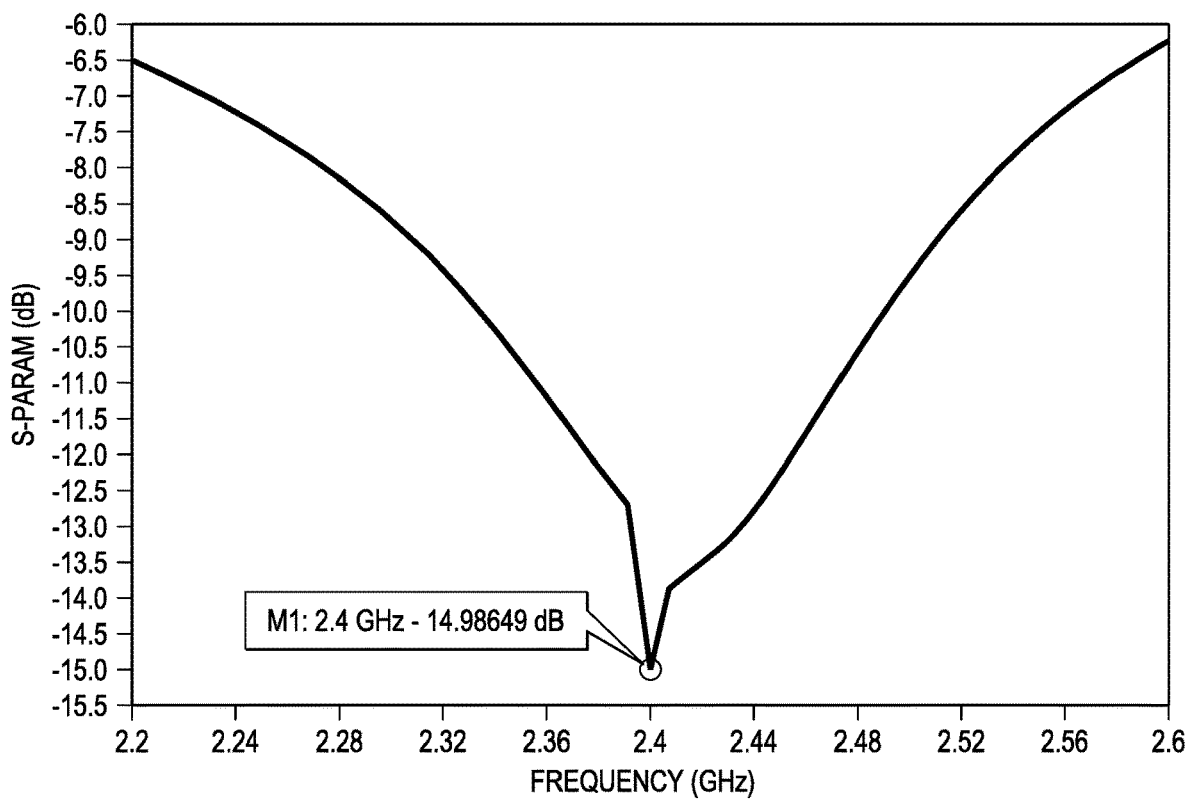
FIG. 12 is a frequency graph illustrating example S-parameter values.

Scattering parameters ("S-parameters") are the elements of a scattering matrix and describe the electrical behavior of linear electrical networks when undergoing steady state stimuli by electrical signals. The $S_{11}$ parameter, also known as the reflection coefficient, is a measurement of input return loss. As the wake-up receiver is an add-on radio, it can be important that it maintain good S-parameters with the passives of the main receiver. FIG. 12 illustrates an example frequency response plot illustrating the $S_{11}$ response for a Wi-Fi wake-up receiver implementing an energy sampling receiver such as receiver 700. As shown, the $S_{11}$ response is about −15 dB at 2.4 GHz.

Figure 13:
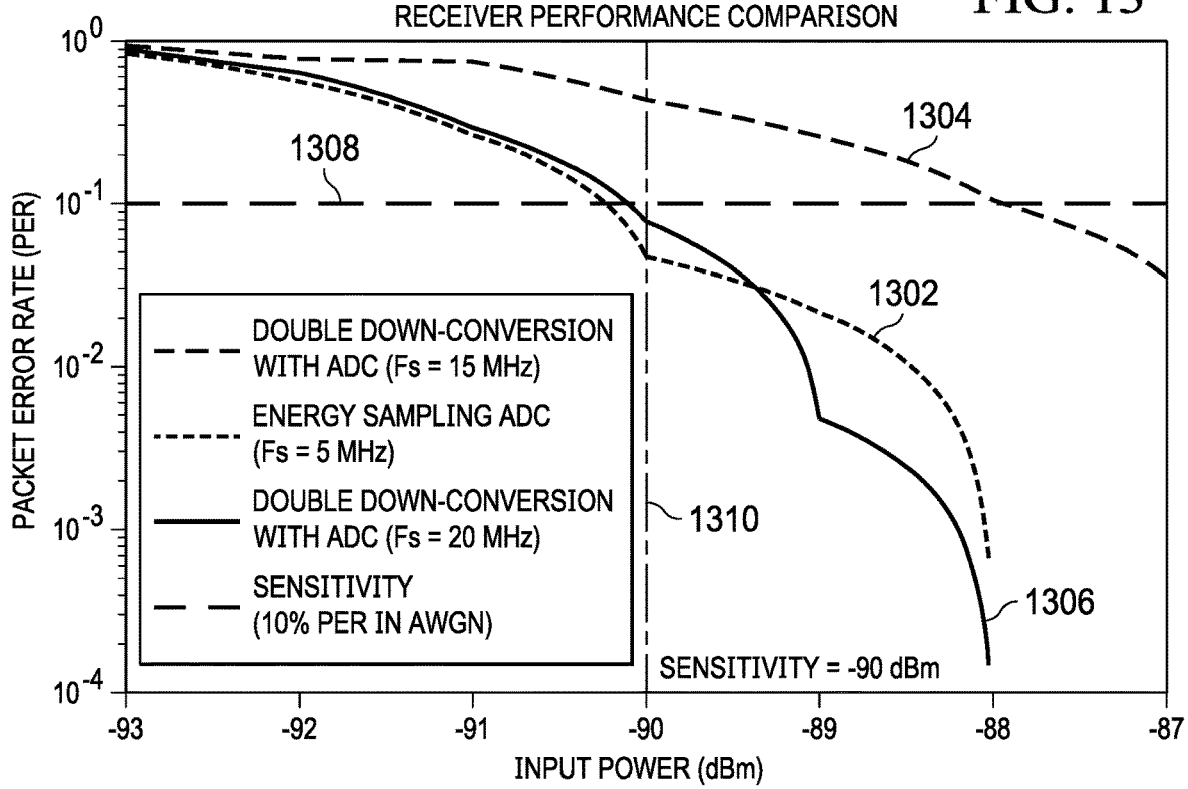
FIG. 13 is an input power graph illustrating receiver performance for different Wi-Fi wake-up receiver architectures.

The graph of FIG. 13 provides a PER performance comparison of a receiver architecture using an energy-sampling receiver architecture such as receiver 700, sampled at 5 MHz, represented by plot 1302, as compared to a receiver architecture using a double down-conversion receiver architecture such as receiver 600, sampled at 15 MHz, represented by plot 1304, and sampled at 20 MHz, represented by plot 1306. A representative target 10 percent PER is shown in the graph of FIG. 13 by horizontal line 1308. A representative target sensitivity of −90 dBm is shown as vertical line 1310. As can be seen, the double down-conversion implementation has too high a PER at the target sensitivity and is not able to meet the target 10 percent PER at the target sensitivity when sampled at 15 MHz, and requires a 20 MHz sampling frequency to meet this target. By comparison, the energy sampling receiver, such as that of FIG. 7, is able to meet this target, despite the much lower sampling rate of 5 MHz, and even shows better PER than the 20 MHz sampled double down-conversion receiver architecture, which is sampled at four times the frequency. Accordingly, the energy sampling receiver represented by plot 1302 is able to achieve comparable or improved performance over the double down-conversion receiver represented by plots 1304 and 1306 with much lower energy consumption.

The performance improvements of the energy-sampling receiver architecture like that of FIG. 7 over the double down-conversion receiver architecture like that of FIG. 6 are summarized in Table 2, below. Table 2 shows an example of the double down-conversion wake-up receiver architecture with a 20 MHz sampling frequency providing the same sensitivity performance as energy-sampling receiver architecture. However, the energy sampling ADC architecture offers relaxed ADC specifications compared to the double down-conversion architecture, permitting a reduced-complexity ADC to be used, resulting in lower power consumption. Example lower power consumption of the energy-sampling ADC architecture (FIG. 7) operating at a 5 MHz sampling frequency and with 5 bits of ENOB as compared to the double down-conversion ADC architecture (FIG. 6) operating at a 20 MHz sampling frequency and with 6 bits of ENOB and including a digital squaring circuit downstream of the ADC is summarized in Table 3, which shows that more than 100 microwatts of power can be saved with the energy-sampling architecture. Although more energy is spent in the squaring operation of the energy-sampling ADC architecture, the overall system power is reduced. There can be, for example, about a five-times power savings in the second down-conversion of the analog front end. Given the reduction in modem operating frequency (from about 20 MHz to about 5 MHz), a four times savings in power and a four times reduction in area can be achieved.

TABLE 2

Summary and comparison of example performance parameters

| Topology | Sampling Frequency | ENOB | LDR Sensitivity |
|---|---|---|---|
| Double Down-Conversion ADC | 15 MHz | 6 bits | −88 dBm |
| Double Down-Conversion ADC | 6 bits | 20 MHz | −90 dBm |
| Energy-Sampling ADC | 5 MHz | 5 bits | −90 dBm |

TABLE 3

Example power consumption comparison

| Topology | ADC | Squaring Circuit | Total Power Consumption |
|---|---|---|---|
| Double Down-Conversion ADC | 125 pW | 1.6 pW | 126.6 pW |
| Energy-Sampling ADC | 20 pW | 6 pW | 26 pW |

Figure 14:
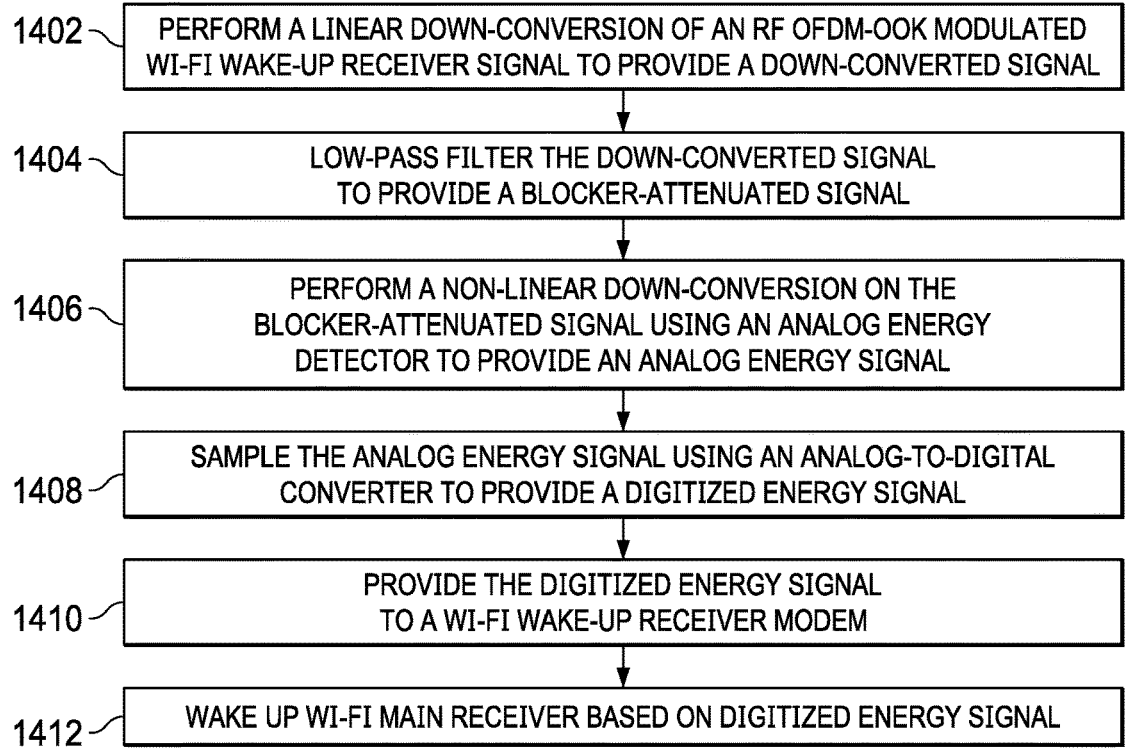
FIG. 14 is a flow chart illustrating an example method of low-power dual down-conversion in a Wi-Fi wake-up receiver.

The flow chart of FIG. 14 illustrates a method 1400 of low-power dual down-conversion in a Wi-Fi wake-up receiver. A Wi-Fi wake-up receiver receives an OFDM-based, OOK modulated RF signal that may include signals from adjacent-channel interferers. The Wi-Fi wake-up receiver can be one such as radio 102 in FIG. 1. A linear down-conversion of the incoming signal is performed 1402 to provide a down-converted signal. The linear down-conversion can be provided by a mixer, such as mixer 704 illustrated in FIG. 7. The down-converted signal is then low-pass filtered 1404 to provide a blocker-attenuated signal, relatively free of interference from adjacent-channel interferers. The low-pass filtering can be done using a filter such as filter 706 of FIG. 7. A non-linear down-conversion is then performed 1406 on the blocker-attenuated signal using an analog energy detector to provide an analog energy signal. This non-linear down-conversion can be performed, for example, by an energy detector circuit, such as ED 710 in FIG. 7, which can be, for example, a squaring circuit of the form provided in FIG. 8. The analog energy signal is then sampled 1408 using an ADC, such as ADC 712, to provide a digitized energy signal. The digitized energy signal can then be provided 1410 to one or more downstream devices, such as a Wi-Fi wake-up receiver modem. Based on the received signal, an internal wake-up signal can be generated that can be delivered 1412 to a main receiver to bring a main receiver, such as main receiver 108 in FIG. 1, out of a low-power sleep mode.

The Wi-Fi wake-up receiver low-power dual down-conversion systems and methods described herein can make use of the modulation and signaling scheme of the IEEE 802.11ba protocol and are based on the principles of linear and non-linear double down-conversion reception, followed by sampling the energy of the signal rather than the signal itself to reduce the effort of ADC. As compared to wake-up receiver architectures like those of FIG. 5 having an envelope detector upstream of an ADC, the energy-sampling receiver architectures and methods of the present application have improved signal-of-interest selectivity, better tolerance of interferers, improved scanning across channels, and are capable of co-existing with other radios, which can be important when Wi-Fi signals share a band with other RF transmission technologies.

As compared to wake-up receiver architectures that rely on direct sampling of an analog input signal, in the energy-sampling architectures and methods described herein, the sampling frequency requirements can be reduced by about 4 times and the and ENOB requirements can be reduced by about 1 bit. A second LO and second mixer are not required. In receiver architectures that use direct sampling, the computational effort of preamble processing blocks in the modem will be high given higher sampling frequency. The chip area required for the direct-sampling receiver signal chain is higher given the higher ENOB and higher gate count requirement in the modem. By contrast, the energy-sampling receiver architecture as described herein uses an envelope detector upstream of the ADC to reduce the area and power consumption of the receiver signal chain by about four times. Additionally, the energy-sampling systems and methods described herein have the advantage of not requiring any accommodating modifications in the system modem or firmware methodology for post-silicon calibrations.

The systems described herein can be implemented, and the methods described herein can be carried out, using an application-specific integrated circuit (ASIC) or multiple coupled ASICs. In this description, the term "based on" means based at least in part on. In this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hard-wired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

Modifications are possible in the described embodiments, and other embodiments are possible, within the scope of the claims.

What is claimed is:

1. A receiver comprising:
   receiver circuitry having an input adapted to be coupled to an antenna terminal, the receiver circuitry comprising:
   an analog mixer having a signal input and an output;
   a low-pass filter having an input coupled to the output of the analog mixer;
   analog envelope detector circuitry having an input coupled to an output of the low-pass filter, the analog envelope detector circuitry configured to provide an energy signal; and
   an analog-to-digital converter (ADC) having an input coupled to an output of the analog envelope detector circuitry, the ADC configured to provide a digitized energy signal based on the energy signal provided by the analog envelope detector circuitry, wherein the receiver is configured to provide a wake-up signal to wake up another receiver based on the digitized energy signal, wherein the analog envelope detector circuitry comprises squaring circuitry that comprises first and second power detection circuits, each comprising a matched differential pair of transistors, a constant current source, and a low-pass filter.

2. The receiver of claim 1, wherein the receiver comprises only one analog mixer in a serial signal chain between the antenna terminal and the ADC.

3. The receiver of claim 1, wherein the receiver is configured to receive, via the antenna terminal, radio-frequency signals encoded using orthogonal frequency division multiplexing based on-off keying (OFDM-OOK) modulation.

4. The receiver of claim 1, wherein the ADC is configured to sample the energy signal at a sampling frequency of about 5 MHz to provide the digitized energy signal.

5. The receiver of claim 1, wherein the ADC is configured to have an effective number of bits (ENOB) of 5.

6. The receiver of claim 1, wherein the receiver is a Wi-Fi wake-up receiver.

7. The receiver of claim 1, further comprising a first RF receiver antenna coupled to the input of the receiver circuitry via the antenna terminal.

8. The receiver of claim 7, further comprising an output coupled to a main transceiver that is also coupled to the first RF receiver antenna, wherein the receiver is configured to provide the wake-up signal to wake up the main transceiver based on the digitized energy signal.

9. The receiver of claim 8, wherein an output of the ADC is coupled to an input of a modem.

10. The receiver of claim 1, wherein the analog mixer is configured to perform a linear down-conversion of a radio-frequency (RF) orthogonal frequency division multiplexing based on-off keying (OFDM-OOK) modulated Wi-Fi wake-up receiver signal to provide a down-converted signal, wherein the low-pass filter is configured to filter the down-converted signal to provide a blocker-attenuated signal, and wherein the analog envelope detector circuitry is configured to perform a non-linear down-conversion on the blocker-attenuated signal to provide the energy signal.

11. The receiver of claim 1, wherein the low-pass filter is configured to attenuate adjacent channel interferer (ACI) signals.

12. The receiver of claim 1, wherein a dynamic range of the receiver is between −90 dBm and −20 dBm.

13. The receiver of claim 1, wherein the receiver has a first dynamic range, and wherein the another receiver has a second dynamic range that is equal to the first dynamic range.

14. The receiver of claim 1, wherein the receiver is configured to provide the wake-up signal in response to receiving a wake-up frame via the antenna terminal.

15. A receiver comprising:
    receiver circuitry having an input adapted to be coupled to an antenna terminal, the receiver circuitry comprising:
    an analog mixer having a signal input and an output;
    a low-pass filter having an input coupled to the output of the analog mixer;
    analog envelope detector circuitry having an input coupled to an output of the low-pass filter, the analog envelope detector circuitry configured to provide an energy signal; and
    an analog-to-digital converter (ADC) having an input coupled to an output of the analog envelope detector circuitry, the ADC configured to provide a digitized energy signal based on the energy signal provided by the analog envelope detector circuitry, wherein the receiver is configured to provide a wake-up signal to wake up another receiver based on the digitized energy signal, wherein the receiver comprises only one local oscillator, wherein the local oscillator has an output coupled to the analog mixer.

16. The receiver of claim 15, wherein the analog mixer is the only mixer in a path between the antenna terminal and the input of the ADC.

17. A receiver comprising:
    receiver circuitry having an input adapted to be coupled to an antenna terminal, the receiver circuitry comprising:
    an analog mixer having a signal input and an output;
    a low-pass filter having an input coupled to the output of the analog mixer;
    analog envelope detector circuitry having an input coupled to an output of the low-pass filter; and
    an analog-to-digital converter (ADC) having an input coupled to an output of the analog envelope detector circuitry, wherein the analog envelope detector circuitry comprises squaring circuitry that comprises first and second power detection circuits, each of the first and second power detection circuits comprising:
    a matched differential pair of field effect transistors (FETs), coupled at their respective drain nodes to a positive voltage rail, and coupled at their respective source nodes to a middle node of the respective power detection circuit, wherein a gate node of a first FET of the matched differential pair of FETs is coupled to a positive differential input port of the respective power detection circuit, and wherein a gate node of a second FET of the matched differential pair of FETs is coupled to a negative differential input port of the respective power detection circuit;
    a constant current source coupled at a first end to the middle node and at a second end to a ground node; and
    an RC low-pass filter coupled at a first terminal to the middle node, at a second terminal to the ground node, and at a third terminal to an output port of the respective power detection circuit.

18. The receiver of claim 17, wherein, apart from connections at their respective inputs and outputs, the first and second power detection circuits are identical to each other.

19. The receiver of claim 17, wherein the positive and negative differential input ports of the first power detection circuit are coupled to respective output ports of the low-pass filter of the receiver circuitry.

20. The receiver of claim 19, further comprising averaging circuitry coupled to respective differential output ports of the low-pass filter of the receiver circuitry, wherein the positive and negative differential input ports of the second power detection circuit are both coupled to an output port of the averaging circuitry.

\* \* \* \* \*